United States Patent
Minamide et al.

(10) Patent No.: US 8,233,724 B2
(45) Date of Patent: Jul. 31, 2012

(54) AUTOMATIC COMPONENT TEACHING DEVICE

(75) Inventors: Yuki Minamide, Fukuoka (JP); Atsushi Tanabe, Fukuoka (JP)

(73) Assignee: Panasonic Corporation, Osaka (JP)

( * ) Notice: Subject to any disclaimer, the term of this patent is extended or adjusted under 35 U.S.C. 154(b) by 1039 days.

(21) Appl. No.: 11/916,155

(22) PCT Filed: May 26, 2006

(86) PCT No.: PCT/JP2006/310537
§ 371 (c)(1),
(2), (4) Date: Nov. 30, 2007

(87) PCT Pub. No.: WO2006/129562
PCT Pub. Date: Dec. 7, 2006

(65) Prior Publication Data
US 2010/0142799 A1    Jun. 10, 2010

(30) Foreign Application Priority Data

Jun. 2, 2005  (JP) .................................. 2005-162634

(51) Int. Cl.
*G06K 9/62* (2006.01)
(52) U.S. Cl. ........................................ 382/224
(58) Field of Classification Search .................... 382/224
See application file for complete search history.

(56) References Cited

U.S. PATENT DOCUMENTS 5,323,321 A * 6/1994 Smith, Jr. .................. 701/211
2005/0025357 A1 * 2/2005 Landwehr et al. ............ 382/170

FOREIGN PATENT DOCUMENTS

| EP | 1 075 173 | 2/2001 |
|---|---|---|
| EP | 1 306 801 | 5/2003 |
| JP | 3-34765 | 2/1991 |
| JP | 5-164520 | 6/1993 |
| JP | 8-101882 | 4/1996 |
| JP | 10-11576 | 1/1998 |
| JP | 2000-221142 | 8/2000 |
| JP | 2001-356006 | 12/2001 |
| JP | 2003-58873 | 2/2003 |
| JP | 2003-251282 | 9/2003 |

(Continued)

OTHER PUBLICATIONS

Matthews et al., "Digial Imaging of Surgical Specimens Using a Wet Scanning Technique", 2001, J Clin Pathol 54:326-327.*

(Continued)

*Primary Examiner* — Anand Bhatnagar
*Assistant Examiner* — Soo Park
(74) *Attorney, Agent, or Firm* — Wenderoth, Lind & Ponack, L.L.P.

(57) ABSTRACT

An automatic component teaching device, which generates component teaching data accurately indicating a configuration of a component is provided, regardless of size of the component. The automatic component teaching device includes a cover sheet 173, of which surface is evenly colored in blue and which is formed to be glossy, a lighting fixture 171*d*, which illuminates a peripheral area including the component with its back facing against a surface of the cover sheet 173, an image pickup device 171*c*, which generates a colored image of the component by taking an image in color of the component illuminated by the lighting fixture 171*d* with one surface of the cover sheet 173 in blue as its background, and in image processing unit 123, which identifies a configuration of the component and generates component teaching data from the colored image generated by the image pickup device 171*c*.

5 Claims, 15 Drawing Sheets

FOREIGN PATENT DOCUMENTS

| | | |
|---|---|---|
| JP | 2004-213562 | 7/2004 |
| JP | 2004213562 A * | 7/2004 |
| WO | 97/39613 | 10/1997 |

OTHER PUBLICATIONS

"Perspex, a Workshop Handbook", 2001, Ineos Acrylics.*
Partial English translation of JP 2004-213562, which was cited in the IDS filed Nov. 30, 2007.
Supplementary European Search Report (in English language), issued Jul. 4, 2008.
Partial English translation of JP 2004-213562, which was cited in the IDS filed Nov. 20, 2007.
International Search Report issued Jun. 20, 2006 in the International (PCT) Application of which the present application is the U.S. National Stage.

* cited by examiner

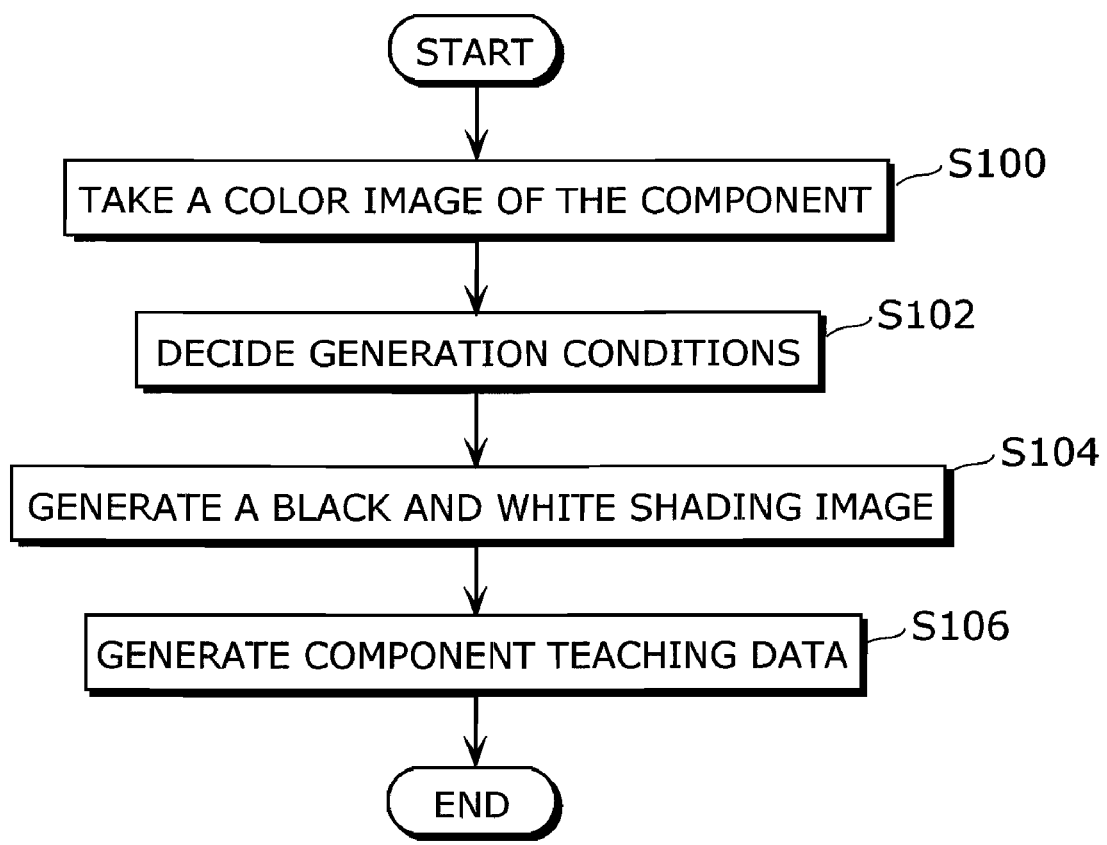

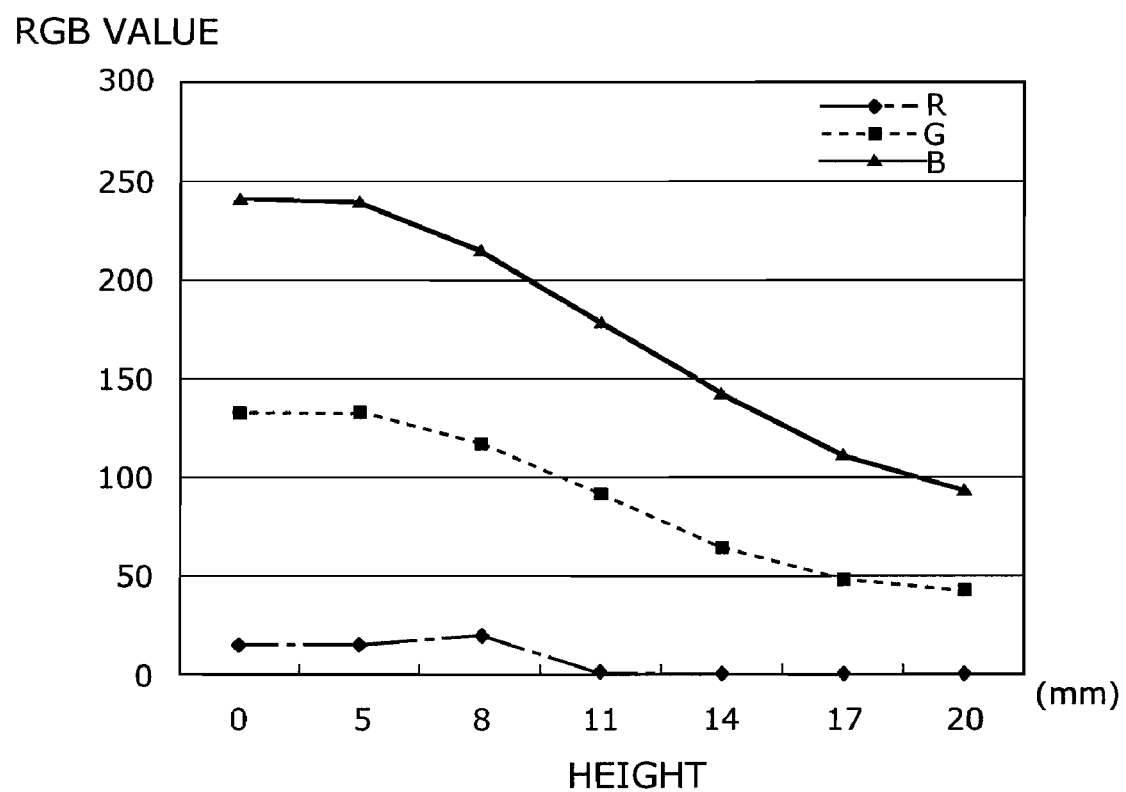

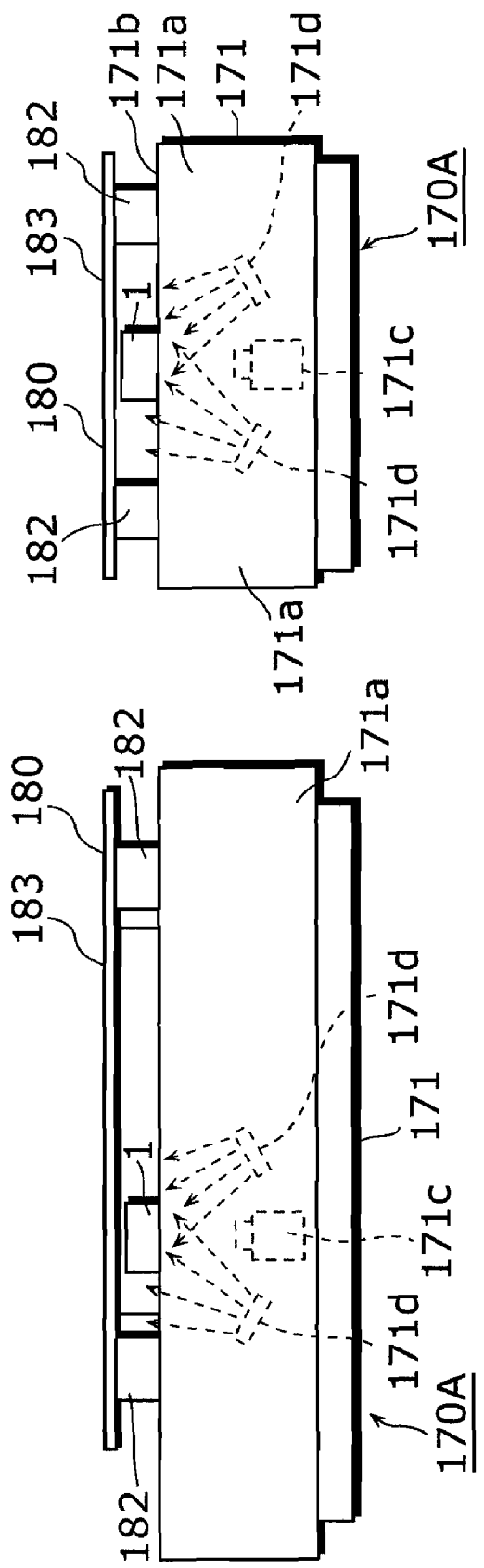

AUTOMATIC COMPONENT TEACHING DEVICE

TECHNICAL FIELD

The present invention relates to an automatic component teaching device, which generates component teaching data that shows a configuration of a component such as an electronic component.

BACKGROUND ART

Automatic component teaching devices have been conventionally suggested, which generates component teaching data indicating a shape and/or a characteristic dimension (a configuration) of an electronic component (for example, see Patent Reference 1) by taking an image of the electronic component.

The automatic component teaching device (a component recognition data generating device) in the above patent reference 1 contains a color scanner and generates a colored image of an electronic component by taking an image of the electronic component with the color scanner. Then, the automatic component teaching device extracts a body of the electronic component and an external shape of its electrodes displayed on the colored image, and generates the component teaching data by measuring their dimensions.

Here, in order to extract its body and external shape of electrodes by using a chroma key technique that is generally utilized for TV broadcasting, etc., the automatic component teaching device of the above reference patent 1 generates the colored image having a background of the electronic component in blue.

FIG. 1 is an explanatory diagram to explain how the colored image of the electronic component is generated with the color scanner in the above mentioned reference patent 1.

At first, as shown in this FIG. 1, an operator places an electronic component 90 on a scanning surface 901 of the color scanner 900 to generate the colored image of the electronic component 90. Next, the operator attaches a blue backside cover 902 on the color scanner 900 so that the background of the colored image becomes blue. Then, the operator covers the scanning surface 901 where the electronic component 90 is located with the backside cover 902 attached in such a way.

With such a state, the color scanner 900 takes an image of the electronic component 90, and generates a colored image of the electronic component 90 of which background is blue.
Patent Reference 1: Japanese Unexamined Patent Application Publication No. 2004-213562

DISCLOSURE OF INVENTION

Problems that Invention is to Solve

However, with the automatic component teaching device in the above mentioned patent reference 1, there is a problem that the device generates component teaching data which shows an inaccurate dimension or shape, etc.

In short, in a case where the color scanner 900 takes an image of a thick electronic component, the electronic component is placed on the color scanner 900. This, however, creates a gap as big as the thickness of the electronic component, between the backside cover 902 and the scanning surface 901. Under such a situation, if the color scanner 900 takes an image of the electronic component, it generates a colored image with a dark background or a colored image with a spotted background. As a result, a body of the electronic component or a shape of electrodes is not accurately extracted and it generates a big error in their size measurement.

FIG. 2 is an explanatory diagram that shows problems in the automatic component teaching device in the above mentioned reference patent.

When the electronic component 91 is thin, a background color of the electronic component 91 taken on a colored image Pic 1 shows vivid even blue. On the other hand, when the electronic component 91 is thick, a spot m1 is generated on the background of the electronic component 91 taken on the colored image Pic 2, as shown in FIG. 2(b), and its background becomes dark.

Therefore, the present invention has been conceived along with consideration of these problems, and an objective of the present invention is to provide an automatic component teaching device that generates component teaching data accurately showing a configuration of the component.

Means to Solve the Problems

In order to achieve the above objective, the automatic component teaching device related to the present invention is an automatic component teaching device that generates component teaching data indicating a configuration of a component to be mounted onto a board, the automatic component teaching device comprising: a glossy member having a surface which is evenly colored and glossy; a lighting unit, which is formed facing against the surface of the glossy member as a backdrop, that illuminates a peripheral area including the component; an image taking unit that generates a colored image of the component by taking an image in color of the component illuminated by the lighting unit so that the surface of the glossy member becomes a background; and a data generating unit that identifies a configuration of the component and generates the component teaching data based on the colored image generated by the image taking unit. For example, color of the surface of the glossy member is blue.

By doing so, light from the lighting unit is reflected efficiently on the surface of the glossy member so that it is possible to prevent a background of the colored image from getting darker by having a longer distance between the lighting unit and the surface of the glossy member. In short, even if the distance between the lighting unit and the surface of the glossy member becomes longer because thickness of the component is great, the background of the colored image can be brighter. As a result, regardless of the size of the component, it is possible to clearly distinguish the component from the background within the colored image, and to generate component teaching data that accurately indicates a configuration of the component.

Also, color of the surface of the glossy member may be made up of a blue component and a green component. For example, the color of the surface of the glossy member is represented as (R, G, B)=(0, 100, 255) when the color is represented as the RGB ranging from 0 to 255 gradation levels.

By doing so, it makes it possible to increase brightness of the blue color in the colored image by adding the green component into the blue of the glossy member, and to generate the component teaching data that indicates a configuration of the component more accurately.

Also, the glossy member may be made of glossy paper or polyvinyl chloride as a material.

By doing so, when the glossy paper is used as a material, it is possible to create the glossy member easily in desired color by printing it with a printer, which is commercially available in the market. Also, when the polyvinyl chloride is used as a material, it is possible to make the background color (for example, blue) of the colored image brighter, and generate the component teaching data that indicates a configuration of the component more accurately.

Also, the glossy member may include a holding unit that maintains a constant distance between the surface and the lighting unit regardless of a dimension of the component. For example, the holding unit is made up of plural pieces that project from the side of the surface of the glossy member, and that support and separate the surface from the lighting unit by a predetermined distance. To be more specific, the component teaching device further includes a translucent panel having translucency, and on which the component is placed, wherein the lighting unit illuminates the component placed on the translucent panel, via the translucent panel, and the glossy member is set on the translucent panel in a way that a tip of each of the plural pieces contacts with the translucent panel and the component can fit between the surface and the translucent panel.

By doing so, there is a clearance gap between a translucent board such as a glass board and the surface of the glossy member, of which width equals to the height h of the plural pieces. As a result, when the component is placed on the gap of the translucent board, the width of the gap between the translucent board and the surface of the glossy member does not change as long as the thickness of component is h or less. As a result, if the distance between the translucent board and the lighting fixture is fixed, the distance between the lighting fixture and the surface of the glossy member does not change and is fixed regardless of the thickness of the component. Therefore, it is possible to maintain brightness on the surface of the glossy member illuminated by the lighting fixture at a certain constant level regardless of the thickness of the component, and to prevent the background of the colored image from getting darker by the thickness of the component.

By the way, the present invention is not limited to the above mentioned automatic component teaching device, and it may also be realized as a generation method of component teaching data conducted by the automatic component teaching device, a program that has a computer execute actions based on the method, a memory media that stores the program, a scanner provided with the automatic component teaching device, and a shooting method of the component by the scanner.

EFFECTS OF THE INVENTION

The automatic component teaching device of the present invention performs an effect that can generate component teaching data accurately indicating a configuration of a component regardless of size of the component.

BRIEF DESCRIPTION OF DRAWINGS

FIG. 6 is a flow diagram to show an overall operation of the automatic component teaching device in the above mentioned invention.

FIG. 8 is a diagram to show a relationship between height of a cover sheet using polyvinyl chloride in the above mentioned invention as its material and the RGB value of the colored image.

FIG. 15A is an external view diagram that shows an external view of a scanner related to the variation 2 in the above mentioned invention.

FIG. 15B is an external view diagram that shows an other external view of a scanner related to the variation 2 in the above mentioned invention.

NUMERICAL REFERENCES

Figure 1:
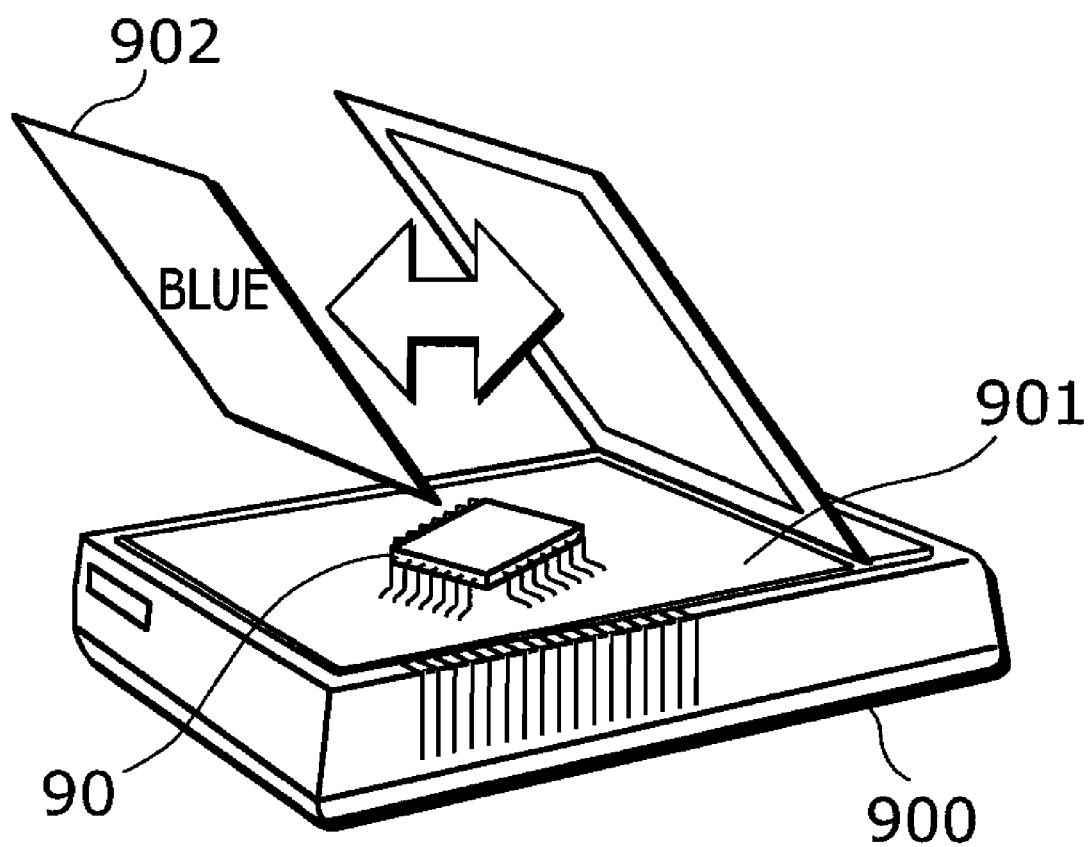
FIG. 1 is an explanatory diagram to explain how a colored image of an electronic component is generated with a conventional color scanner.
Figure 2:
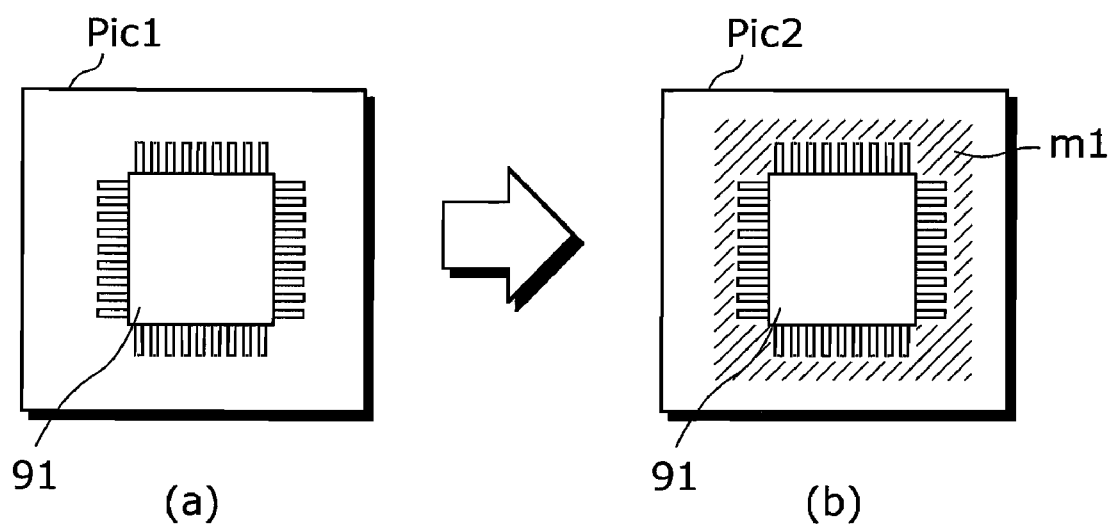
FIG. 2 is an explanatory diagram to explain problems of a conventional automatic component teaching device.

100 Automatic component teaching device
110 Operating unit
120 Controlling unit
121 Peripheral device controlling unit
122 Input and output processing unit
123 Image processing unit
130 Display unit
170 Scanner
171 Scanner main unit
171a Enclosure
171b Glass board
171c Image taking element 171d Lighting fixture
172 Cover
173 Coversheet

BEST MODE FOR CARRYING OUT THE INVENTION

The following describes the embodiments according to the prevent invention with reference to the drawings.

Figure 3:
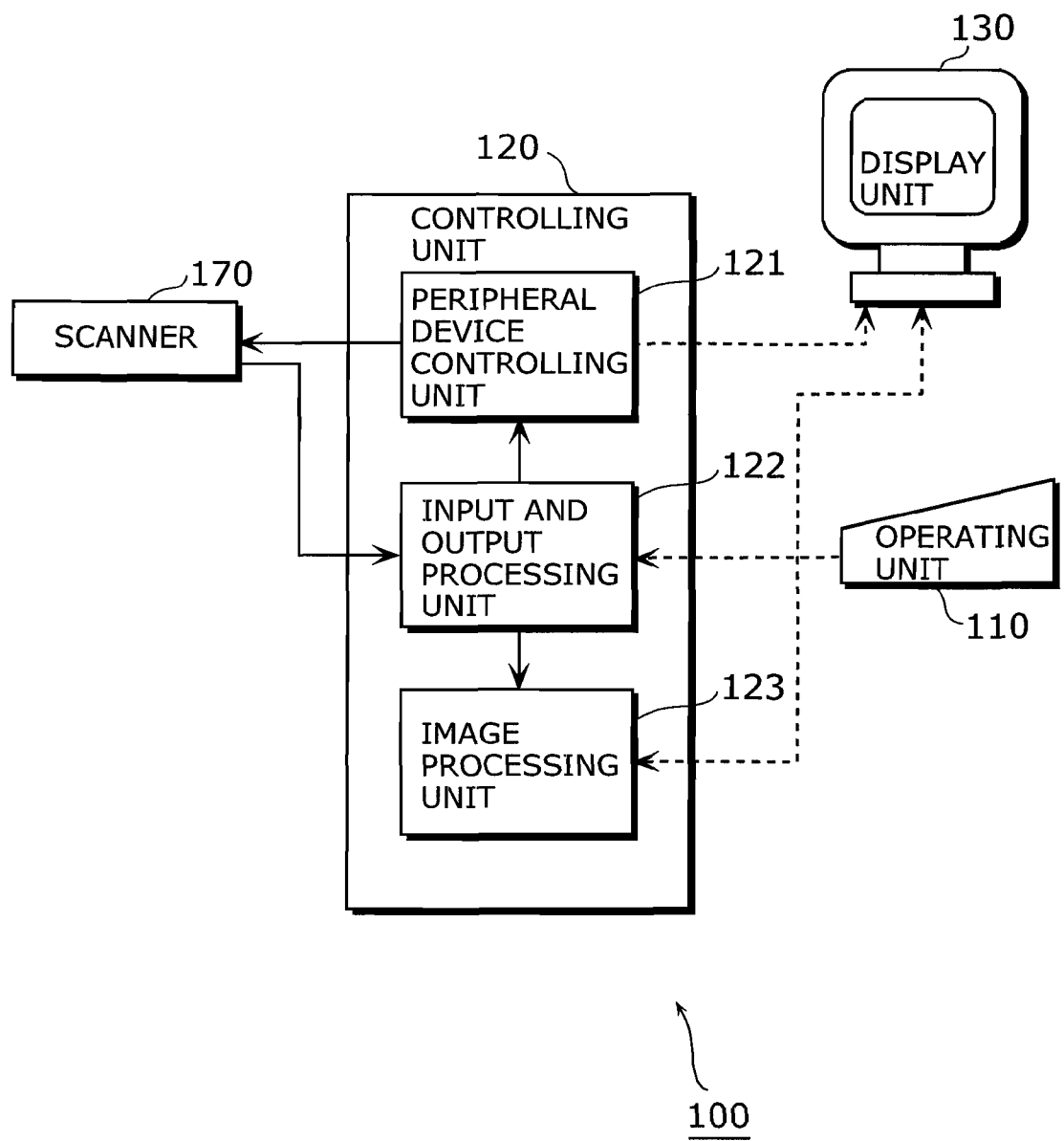
FIG. 3 is a block diagram that shows a configuration of an automatic component teaching device using an image generating method of the component in the present invention.

FIG. 3 is a block diagram that shows a configuration of the automatic component teaching device in the embodiments of the present invention.

This automatic component teaching device 100 is the one that generates component teaching data, which shows a configuration or a characteristic dimension of an electronic component (hereinafter simply called as a component), and includes a scanner 170 that takes an image of the component, an operating unit 110 that accepts operations executed by an operator, a display unit 130 that consists of, for example, a liquid crystal display, etc., a controlling unit 120 that controls the scanner 170 and the display unit 130 based on the operations accepted by the operating unit 110. Also, the controlling unit 120 includes a peripheral device controlling unit 121, an input and output processing unit 122 and an image processing unit 123.

In the automatic component teaching device 100 such as the present embodiment, the scanner 170 has a cover sheet (glossy member) that is characteristic and explained later, and it is possible with this cover sheet to generate component teaching data that accurately shows a configuration of the component regardless of size of the component.

The following describes the cover sheet in details after an overall configuration and motions of the automatic component teaching device 100 of the present embodiment are described.

Figure 4A:
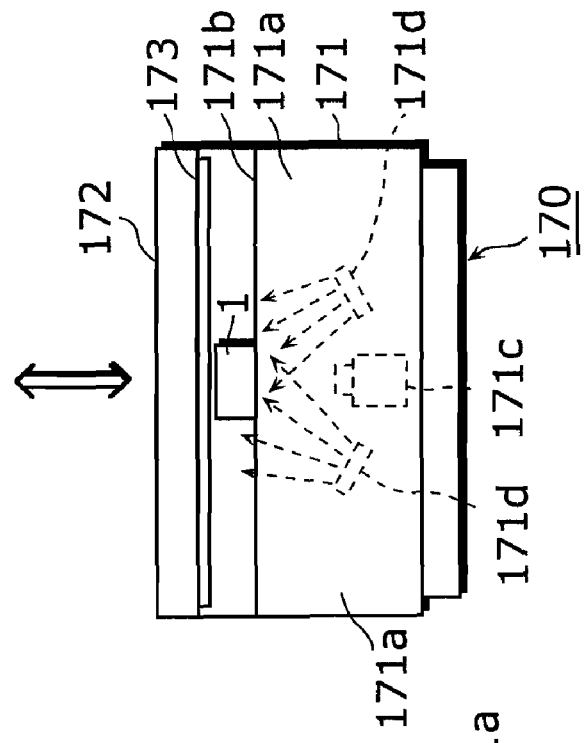
FIG. 4A is an external overview diagram of an external view of a scanner in the above mentioned invention.
Figure 4B:
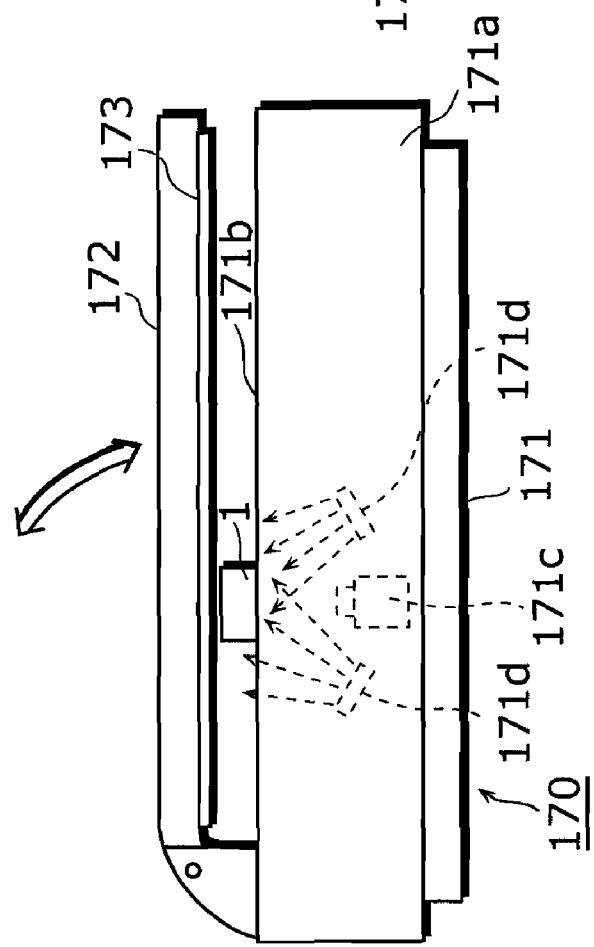
FIG. 4B is an external overview diagram of an other external view of the scanner in the above mentioned invention.

FIG. 4A and FIG. 4B are external view diagrams that show an external view of the scanner 170.

The scanner 170 consists of a scanner main unit 171, a cover 172 and the above mentioned cover sheet 173 as shown in these FIG. 4A and FIG. 4B.

The scanner main unit 171 includes a simple rectangular box type enclosure 171a, an image pickup device 171c and a lighting fixture 171d that are embedded in the enclosure 171a, and a glass board that is mounted onto an upper surface of the enclosure 171a.

The cover 172 is installed to the enclosure 171a of the scanner main unit 171 in a way it can rotate freely. When the operator places a component 1 on the scanner 170, the cover 172 is kept away (being opened) from the glass board 171b of the scanner main unit 171. When the operator takes an image of the component 1, the cover 172 is set to cover (being closed) the glass board 171b of the scanner main unit 171.

The cover sheet 173 is installed to a surface facing to the glass board 171b of the cover 172. Also, a color of this cover sheet 173 is blue.

When the operator takes an image of the component 1, he/she opens the cover 172, and attaches the cover sheet 173 on the cover 172. Then, the operator places the component 1 on the glass board 171b and closes the cover 172. Under such a situation, the scanner 170 illuminates the component 1 placed on the glass board 171b with a lighting fixture 171b of the scanner main unit 171, and takes an image of the component 1 in color as the scanner 170 moves the image pickup device 171c, and generates a colored image of the component 1 of which background is blue.

For example, the above scanner 170 may consist of a commercially supplied scanner with the cover sheet 173 installed.

The input and output processing unit 122 of the controlling unit 120 acquires operational contents accepted by the operating unit 110, and outputs the operational contents to the peripheral device controlling unit 121 and the image processing unit 123. Also, the input and output processing unit 122 acquires a colored image generated by the scanner 170, and outputs the colored image on the image processing unit 123.

The peripheral device controlling unit 121 acquires operational contents accepted by the operating unit 110 via the input and output processing unit 122, and controls the scanner 170 and the display unit 130 according to the operational contents.

The image processing unit 123 executes a specific process for the colored image of the component, which is generated by the scanner 170, generates a black and white shading image, which expresses an outline or electrodes of the component in shading black and white, and has the black and white shading image displayed on the display unit 130. Also, the image processing unit 123 acquires operational contents accepted by the operating unit 110 via the input and output processing unit 122, and decides a generation condition for generating the component teaching data that shows an outline or a characteristic dimension of the component according to the operation contents. Then, the image processing unit 123 generates component teaching data from the black and white shading image and the generation condition. In short, this image processing unit 123 is configured as a data generation unit.

The generation condition is, for example, an electrode type of the component, a configuration of a grounding surface of the electrode (hereinafter called as an electrode grounding surface configuration), etc. The operator operates the operating unit 110 according to a screen displayed on the display unit 130 based on control through the controlling unit 120, and inputs an electrode type of the component and an electrode grounding surface configuration.

Figure 5A:
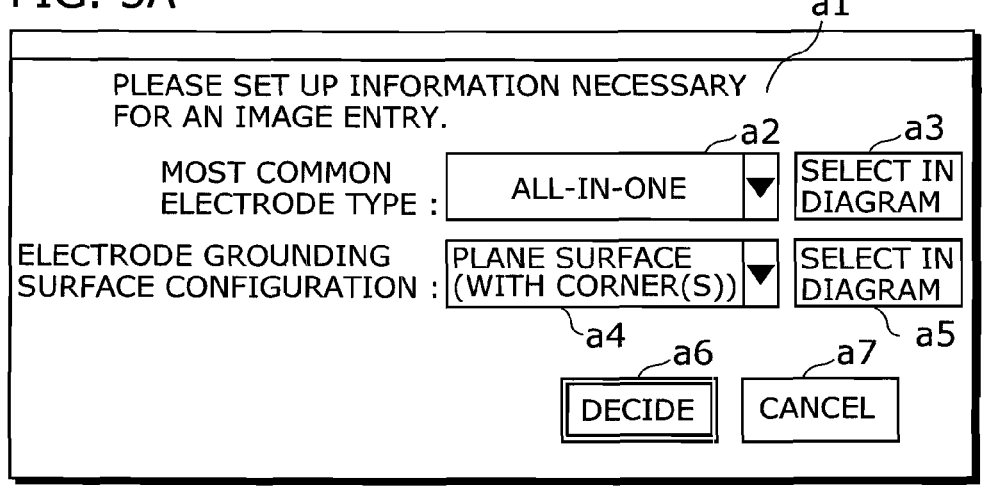
FIG. 5A is a screen display diagram to show an example of a screen that is displayed in a display unit for an image processing unit in the above mentioned invention to decide a generation condition.
Figure 5B:
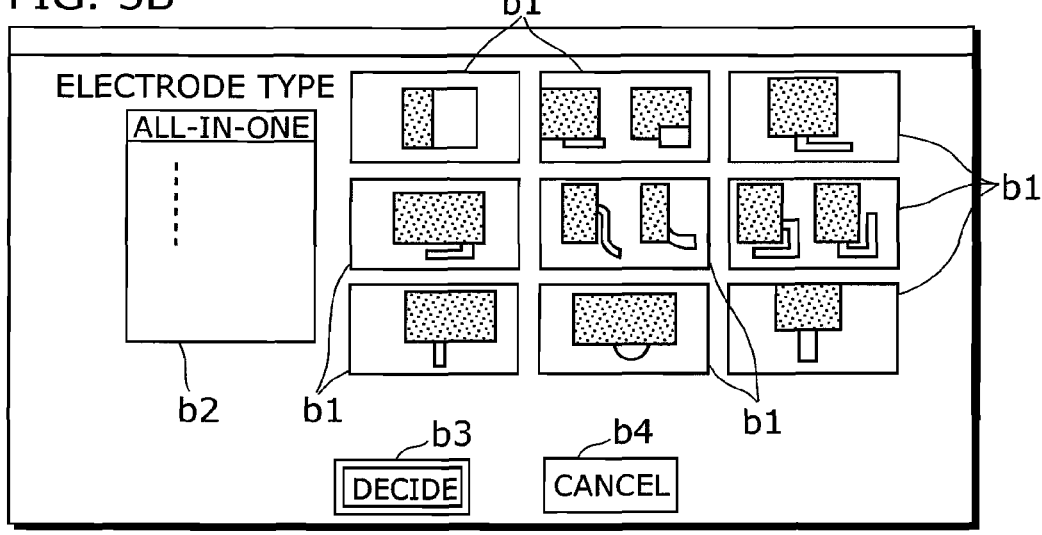
FIG. 5B is a screen display diagram to show another example of the screen that is indicated in the display unit for the image processing unit in the above mentioned invention to decide a generation condition.
Figure 5C:
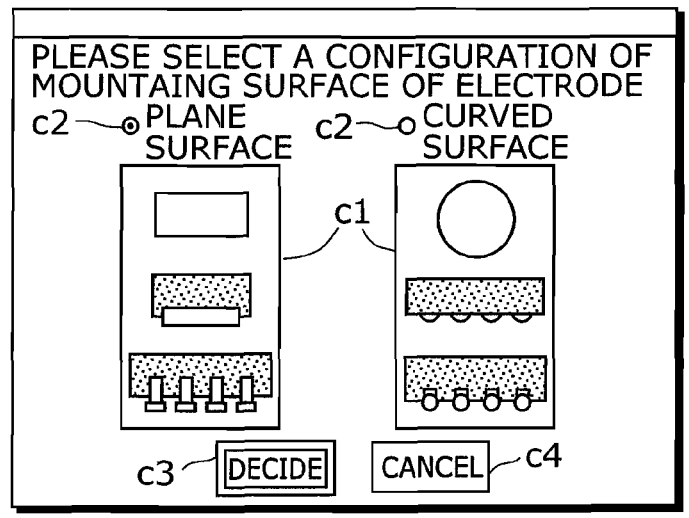
FIG. 5C is a screen display diagram to further show another example of the screen that is indicated in the display unit for the image processing unit in the above mentioned invention to decide a generation condition.

FIG. 5A to FIG. 5C are screen display diagrams to show examples of the screens displayed on the display unit 130 for the image processing unit 123 to decide a generation condition.

The image processing unit 123, as shown in FIG. 5A displays on the display unit 130 a message a1 such as "Please set up information necessary for an image entry", an electrode type field a2 for selecting and displaying a name of the electrode type from a pull down menu, an electrode type selection button a3 for selecting an electrode type from a diagram, a surface configuration field a4 for selecting and displaying a name of an electrode grounding surface configuration from a pull down menu, a surface configuration selection button a5 for selecting an electrode grounding surface configuration from a diagram, a decision button a6 for prompting to decide a generation condition with contents displayed on the electrode type field a2 and the surface configuration field a4, and a cancellation button a7 for prompting to cancel the decision of the generation condition.

When the screen shown in FIG. 5A is displayed, the operator directly displays the most common electrode type of the component on the electrode type field a2, or indirectly displays it by using the electrode type selection button a3.

When it is indirectly displayed, the operator selects the electrode type selection button a3. As a result of the selection, the display unit 130 displays, as shown in FIG. 5B, for example, a graphic button b1 that shows graphics of 9 electrode types, a name field b2 that shows names of the 9 electrode types in a list format, a type decision button b3 that prompts to decide an electrode type shown by the selected graphic button b1, and a type cancellation button b4 that prompts to cancel the selection of the electrode type using the graphic. Here, the operator finds a graphic that shows an electrode type of the component from the 9 graphics shown on the graphic button b1, and selects the graphic button b1 showing the graphic through operating the operating unit 110. Once the graphic button b1 is selected, the name of the electrode type indicated by the selected graphic button b1 is highlighted among each of the names displayed on the name field b2. Next, when the operator selects the type decision button b3 by operating the operating unit 110, the display unit 130 displays the screen shown in FIG. 5A again. Within the screen, the name of the electrode type indicated by the graphic button b1 selected as mentioned above is displayed in the electrode type field a2. As mentioned above, the operator can easily enters the name from the graphic by using the electrode type selection button a3, without knowing the electrode type name of the component.

Also, when the screen indicated in FIG. 5A is displayed, the operator directly makes an electrode grounding surface configuration of the component be displayed on the surface configuration field a4 through operating the operating unit 110, or indirectly makes it be displayed by using the surface configuration selection button a5.

When it is indirectly displayed, the operator selects the surface configuration selection button a5. As a result of the selection, the display unit 130 displays, as shown in FIG. 5C, a graphic c1 that shows, for example, two electrode grounding surface configurations, a check box c2 that corresponds to each of the graphic c1, a surface configuration decision button c3 that prompts to select an electrode grounding surface configuration corresponding to the checked check box c2, and a surface configuration cancellation button c4 that prompt to cancel the selection of the electrode grounding surface configuration using a graphic. Here, the operator finds a graphic that shows the electrode grounding surface configuration of the component from two of the graphic c1, and puts a check mark on the check box c2 (inputs a black dot) that corresponds to the graphic by operating the operating unit 110. Next, if the operator selects the surface configuration decision button c3 by operating the operating unit 110, the display unit 130 displays the screen shown in FIG. 5A again. Within the screen, a name of the electrode grounding surface configuration corresponding to the check box c2 checked as mentioned above is displayed in the surface configuration field a4. In this way, the operator can easily enter the name from the graphic by using the surface configuration selection button a5 without knowing the name of the electrode grounding surface configuration of the component.

As described above, with each of the names for the electrode type and the electrode grounding surface configuration being selected and displayed on the electrode type field a2 and the surface configuration field a4 on the screen indicated in FIG. 5A, if the operator selects the decision button a6, the electrode type and the electrode grounding surface configuration of the names selected and displayed are decided as generation conditions for the component teaching data.

The image processing unit 123 specifies an algorithm that shows an area of the component of which dimension should be measured, its measurement and processing method, and so on from the generation conditions decided in this way and its black and white shading image. Then, the image processing unit 123 measures the dimension of the above mentioned area of the component, which is a characteristic dimension, from the black and white shading image using the algorithm, and generates the component teaching data that shows its characteristic dimension and a configuration of the component.

Also, the image processing unit 123 displays the component teaching data on the display unit 130.

The component teaching data like this is used for identifying misalignment of the component, etc. in a component mounting device which mounts a component onto a board. That is to say, when the component mounting device mounts the component onto the board, it picks up the component with its head and brings it to a specific area on the board, and mounts the component on the area. In a middle of the transportation, the component mounting device takes an image of the component picked up by the head with a camera. Then, the component mounting device recognizes misalignment of the component from the result of the image taken and the above mentioned component teaching data, and drives the head, etc. to solve the misalignment. By doing this way, it is possible to accurately mount the component on the specific area of the board.

FIG. 6 is a flow diagram that shows overall motions of the automatic component teaching device 100.

At first, the automatic component teaching device 100 takes a colored image of the component with the scanner 170 (Step S100), and further decides a generation condition based on operations by the operator (Step S102).

Next, the automatic component teaching device 100 generates a black and white shading image of the component from the colored image using the chroma key technique (Step S104). Here, the automatic component teaching device 100 detects, for example, an external configuration of the component from the black and white shading image generated by the Step S104. The detection of the external configuration of the component is performed from differences in black and white shading values. Also, the automatic component teaching device 100 specifies a specific algorithm with reference to the generation condition, etc. decided by the Step S102.

Then, lastly the automatic component teaching device 100 measures a characteristic dimension of the component from the external configuration, etc. of the component detected from the black and white shading image by using the above mentioned algorithm, and generates the component teaching data showing the measurement result (Step S106).

Here, the automatic component teaching device 100 such as the one like the present embodiment has a characteristic cover sheet 173 for the scanner 170 using a glossy member.

This cover sheet 173 is glossy, and has one surface which is uniformly colored in blue.

For example, this cover sheet 173 can be created by a sheet of white glossy paper as its material, which printed by a printer to have one surface of the glossy sheet colored in blue.

For the glossy sheet, "Ink jet photographic paper" (Model No.: JPSK-A4G), a name of a product made by Nakabayashi Co., Ltd. is used.

Also, for the printer, for example, "HP PSC 1350", a name of a product made by Nippon Hewlett-Packard Co., Ltd. is used. When it is printed by this printer, "HP 56 Print Cartridge Black (large size)" and "HP 57 Print Cartridge 3 Colors (large size)", names of products made by the same company are set as ink and printing is performed with setup of "HP Premium Plus Photograph Paper".

Also, for the printer, "PIXUS iP7100" (Model No.: PIXUSIP7100), a name of a product made by Cannon, Co., Ltd. may be used. When it is printed by this printer, for example, "Yellow Ink Tank" (Model No.: BCI-7Y), "Magenta Ink Tank" (Model No.: BCI-7M), "Black Ink Tank" (Model No.: BCI-7BK), "Cyan Ink Tank" (Model No.: Model No.: BCI-7C), "Photo Magenta Ink Tank" (Model No.: BCI-7PM) and "Photo Cyan Ink Tank" (Model No.: BCI-7PC), names of products made by the same company are set. Then, the printing is performed with setup of "Print with Pro Photo Paper". By the way, a color laser printer is not preferable since it tends to generate spots or thin spots. An ink jet printer is more appropriate.

Because the cover sheet 173 created in this way is glossy, it reflects light illuminated from the lighting fixture 171*d* embedded in the enclosure 171*a* of the scanner main unit 171 with a high reflection ratio. Therefore, as a height of the cover sheet 173 from the glass board 171*b* gets higher while the cover 172 is being closed, it is possible to restrain the background of the colored image from being dark.

Also, regarding the blue color of such a cover sheet 173, it is preferable to be an R value=0 and a B value=255 in the RGB value indicated by the R value (0 to 255), the G value (0 to 255) and the B value (0 to 255). Also, it may be the G value=0, but it is possible to increase brightness in the blue by increasing the G value a little. In short, as the height of the cover sheet 173 from the glass board 171*b* gets higher, it is possible to further restrain the background of the colored image from being dark.

That is to say, the automatic component teaching device 100 of the present embodiment can generate the colored image of the component with a bright background even if the thickness of the component is greater. As a result, it is possible to generate the component teaching data that accurately shows a configuration of the component.

Figure 7A:
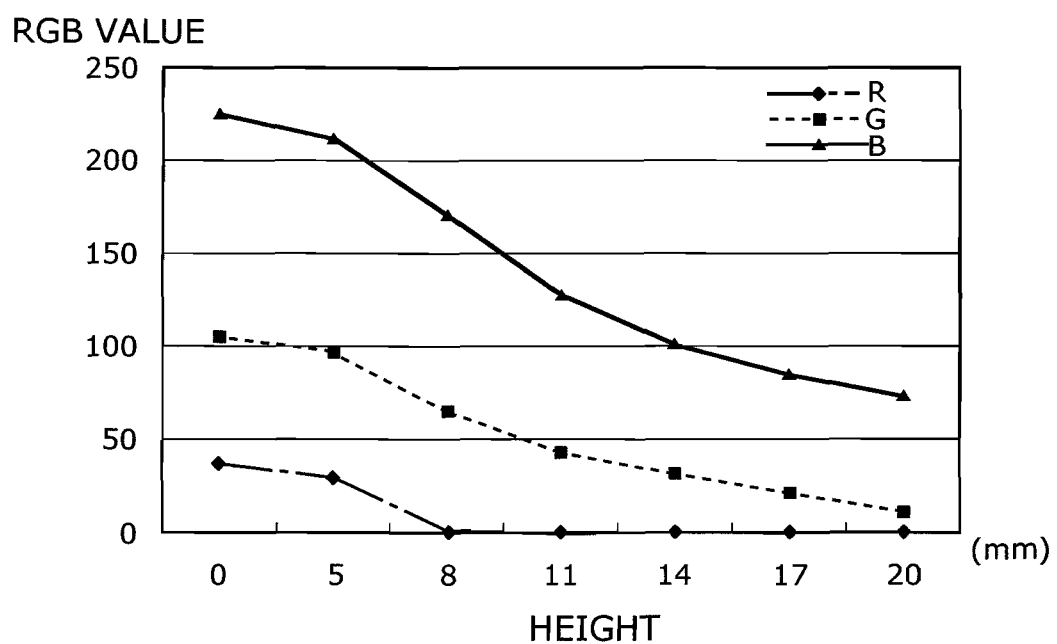
FIG. 7A is a diagram to show a relationship between height of a cover sheet using glossy paper in the above mentioned invention as its material and an RGB value of a colored image.
Figure 7B:
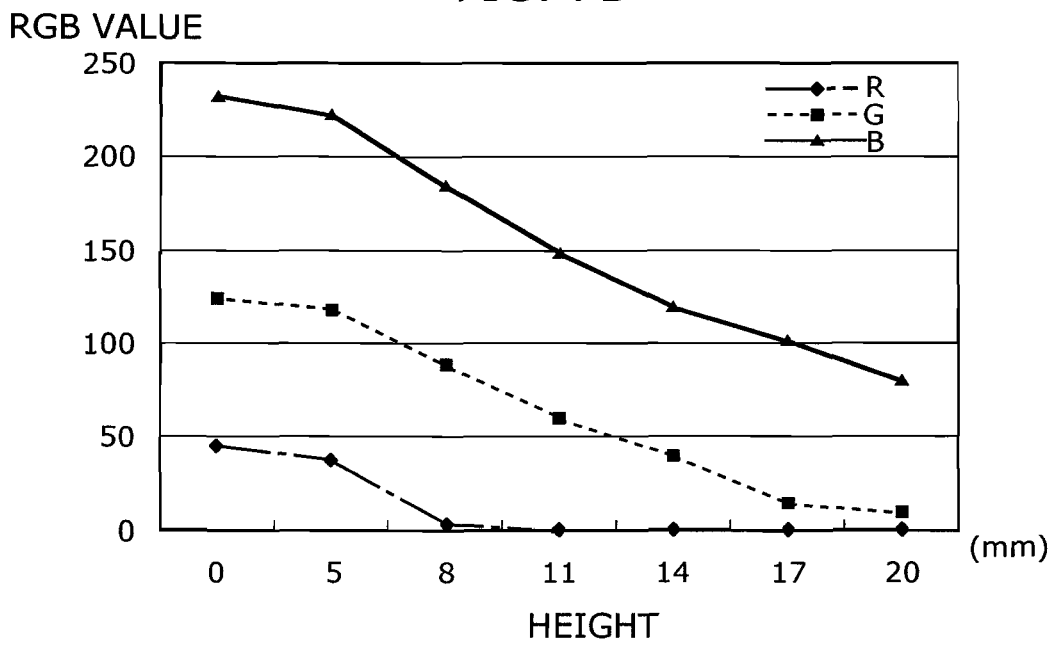
FIG. 7B is a diagram to show an other relationship between height of the cover sheet using the glossy paper in the above mentioned invention as its material and the RGB value of the colored image.

FIG. 7A and FIG. 7B are diagrams that show a relationship between the height of the cover sheet 173 using glossy paper as its material and the RGB value of the colored image.

If the blue color of the cover sheet 173 is expressed with the RGB values=(0, 50, 255), just as shown in FIG. 7A, the RGB values (R value, G value and B value) of the colored image generated by the scanner 170 become smaller as the height of the cover sheet 173 becomes higher. However, because the blue color of the cover sheet 173 is glossy, it is possible to reduce a fluctuation rate of the B value for the height of the cover sheet 173. Also, as the G value of the cover sheet 173 is 50, it is possible to make the B value of the colored image bigger than a case when the G value is zero. In short, it is possible to make the color of the colored image brighter, and to restrain the colored image from being darker even if the height of the cover sheet 173 gets higher.

As shown in FIG. 7A, in the same way as described above, even if the blue color of the cover sheet 173 is expressed with the RGB values=(0, 50, 255), the RGB values (R value, G value and B value) of the colored image generated by the scanner 170 become smaller as the height of the cover sheet 173 becomes higher. However, because the blue color of the cover sheet 173 is glossy, it is possible to reduce a fluctuation rate of the B value for the height of the cover sheet 173. Also, since the G value of the cover sheet 173 is 50, it is possible to make the B value of the colored image bigger than a case when the G value is zero. In short, it is possible to make the blue color of the colored image brighter and to restrain the colored image from being darker even if the height of the cover sheet 173 gets higher.

As shown in FIG. 7B, in the same way as described above, even if the blue color of the cover sheet 173 is expressed with the RGB values=(0, 100, 255), the RGB values (R value, G value and B value) of the colored image generated by the scanner 170 become smaller as the height of the cover sheet 173 gets higher. However, because the G value of the cover sheet 173 is 100, the B value of the colored image can further be bigger than the one for a case when the G value is 50. In short, it is possible to make the blue color of the colored image further brighter.

In the present embodiment, glossy paper is used as a material for the cover sheet 173, however it may be a glossy polyvinyl chloride sheet colored in blue, which is shown with the RGB values=(0, 100, 255). For example, the material of the cover sheet 173 can be "Enbi sheet (Unisandai)" (Product No. EB4350-6), a name of a product made by Hikari Co., Ltd.

FIG. 8 is a diagram that shows a relationship between the height of the cover sheet 173 using a polyvinyl chloride sheet as its material and the RGB values of the colored image.

If the blue color of the cover sheet 173 is expressed with the RGB values=(0, 100, 255), as shown in FIG. 8, the RGB values (R value, G value and B value) of the colored image generated by the scanner 170 become smaller as the height of the cover sheet 173 gets higher. However, as described above, since the blue color of the cover sheet 173 is glossy, it is possible to make the fluctuation rate of the B value smaller for the height of the cover sheet 173. Also, since the G value of the cover sheet 173 is 100, the B value of the colored image can further be bigger than a case when the G value is 0. In short, in the same way as the case when glossy paper is used for the cover sheet 173, it is possible to make the blue color of the colored image further brighter and to restrain the colored image from being darker even if the height of the cover sheet 173 gets higher.

(Variation 1)

Here explains a first variation of present embodiments for the automatic component teaching device.

The automatic component teaching device related to the present variation is equipped with a component mounting device that mounts a component onto a board.

Figure 9:
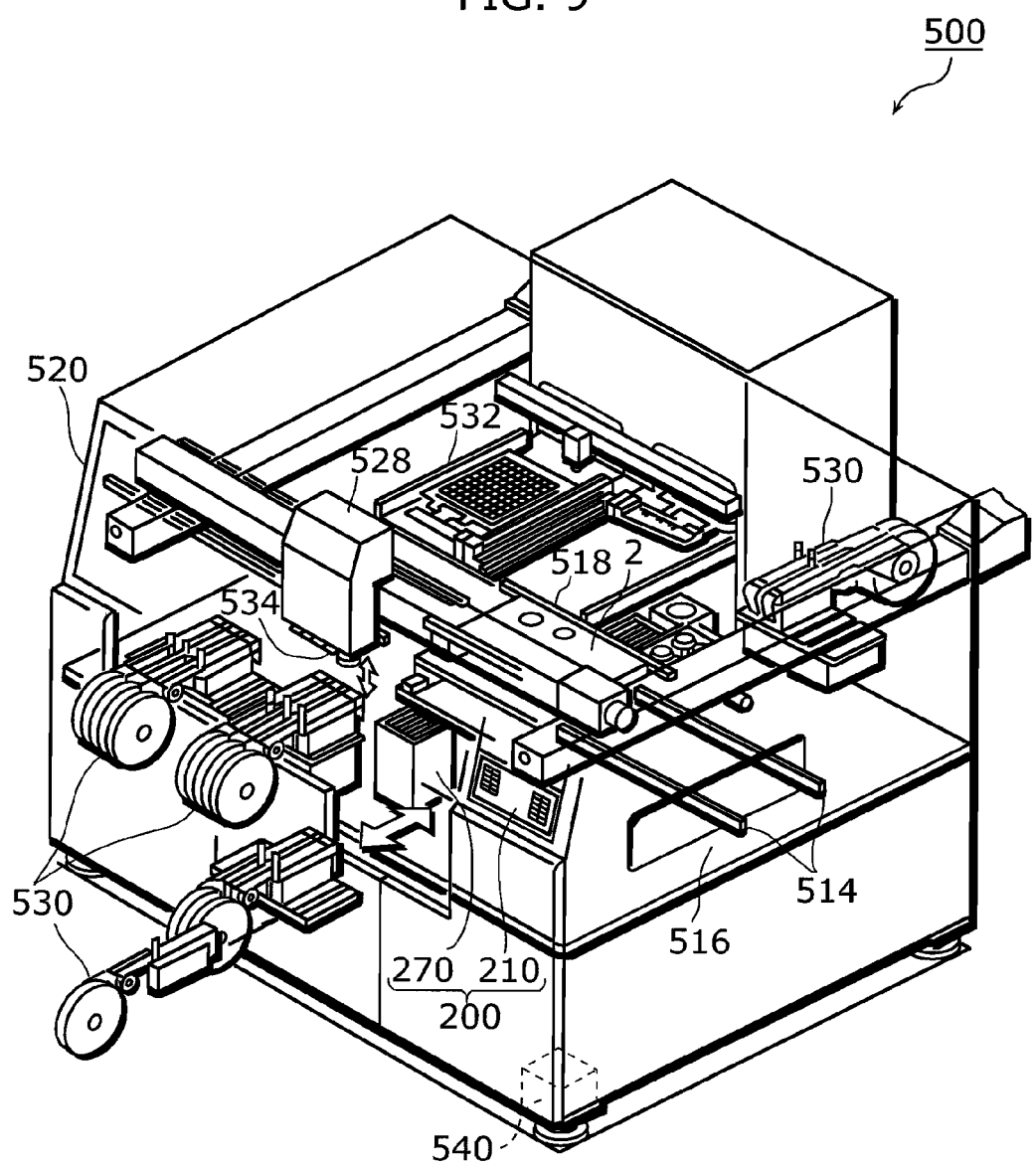
FIG. 9 is an external overview diagram that shows an external view of a component mounting device that contains an automatic component teaching device related to a variation 1 in the above mentioned invention.

FIG. 9 is an external view diagram that shows an external view of the component mounting device that contains the automatic component teaching device related to the present variation.

This component mounting device 500 includes a guide rail 514 that transports a board 2, a component feeder 530 that supplies a component such as a resistor and a capacitor, a component tray 532 where relatively big size of components such as an IC (Integrated Circuit) like an SOP (Small Outline Package) or a QFP (Quad Flat Package) or a connector are placed, a head 528 that picks up a component placed on the component tray 532 or a component supplied from the component feeder 530 and mounts onto the board 2, an automatic component teaching device 200, and a recognition unit 540 that refers to the component teaching data generated by the automatic component teaching device 200 and recognizes misalignment of the component picked up by the head 528.

The component mounting device 500 like this generates component teaching data of a component picked up by the head 528 by the automatic component teaching device 200 in advance before the component is mounted. When the component is mounted, the component mounting device 500 takes an image of the component picked up by the head 528, and recognizes any misalignment of the component picked up by the head 528 by using the result of the taken image and the component teaching data generated in advance.

The board 2 is transported from a loader 516 of the component mounting device 500 to a mounting position 518 by a transportation belt drive, which is not shown in the drawing, in a way the board 2 is put on the guide rail 514, and then transported to an unloader unit 520 once the component is mounted on the mounting position.

The head 528 includes plural pickup nozzles 534 that pick up the component on their tips, and move in a direction along a plane surface of the board 2, which is driven by a motor, etc. not shown in the drawing. Through the movement of the head 528 like this, the component is transported. When the component teaching data is generated, the head 528 transports the component to the image shooting position, which is described later. On the other hand, when the component is mounted, the head 528 at first transports the component to the image shooting location, and after an image of the component is taken at the image shooting location, the head 528 transports the component to the board 2 located at the mounting position 518. Then, the head 528 mounts the component onto the board 2 by driving the pickup nozzle 534.

The automatic component teaching device 200 related to the present variation is provided to take an image of the component located at the image shooting location. In short, the automatic component teaching device 200 takes an image of the component picked up by the pickup nozzle 534 of the head 528 from an opposite side of the head 528 (from the bottom, in a center of FIG. 9).

Figure 10:
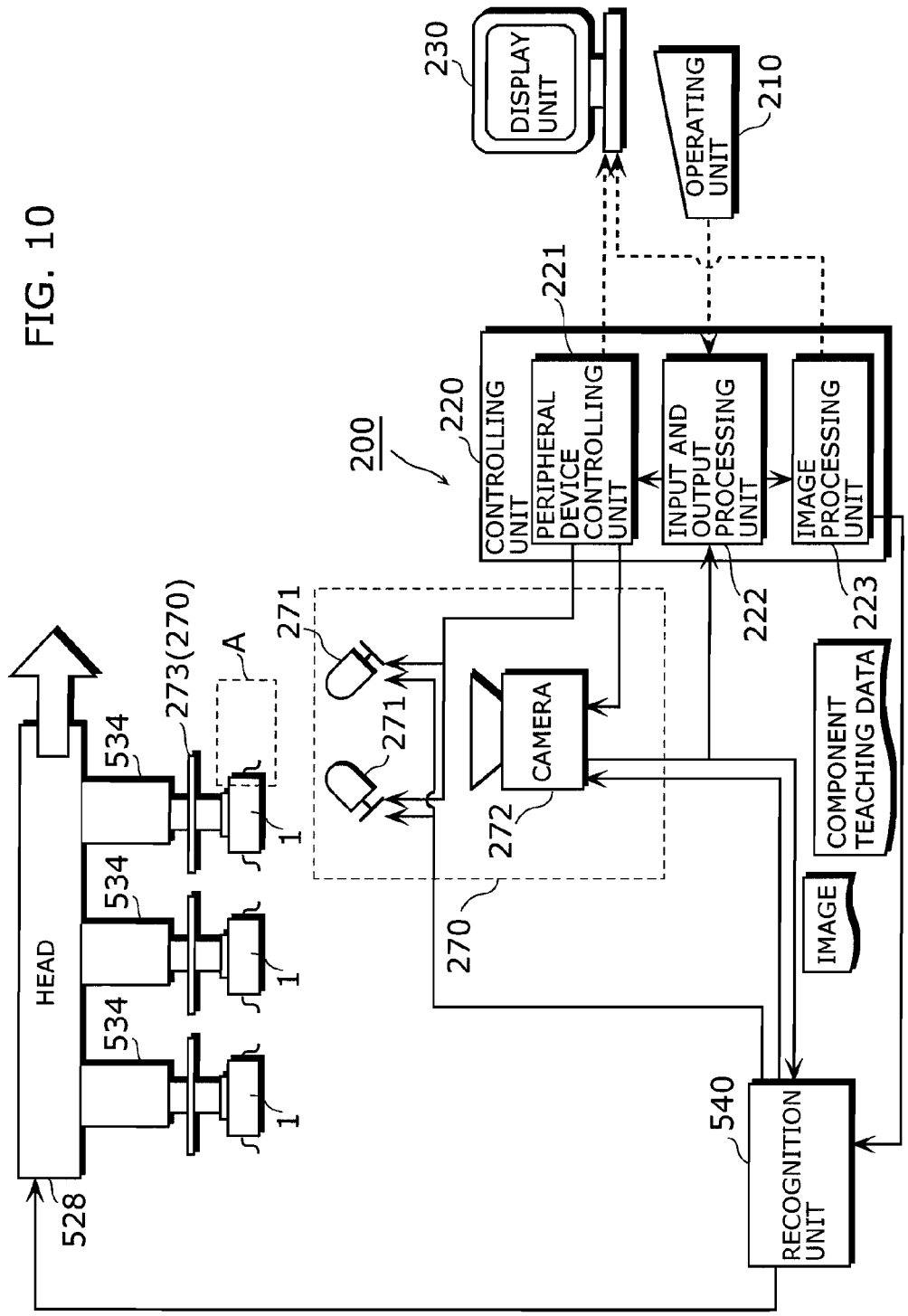
FIG. 10 is a block diagram that shows a configuration of the automatic component teaching device related to the variation 1 in the above mentioned invention.

FIG. 10 is a block diagram that shows a configuration of the automatic component teaching device 200 related to the present variation.

The automatic component teaching device 200 related to the present variation includes a display unit 230, an operating unit 210, a controlling unit 220, and additionally an image shooting unit 270 that takes an image of the component 1 picked up by the head 528, in stead of the scanner 170 of the automatic component teaching device 100 in the above mentioned embodiment.

The display unit 230 and the operating unit 210 related to the present variation has the same functions as those of the display unit 130 and the operating unit 110 in the above mentioned embodiment. The operating unit 210 is installed in the component mounting device 500 to be operable for the operator (see FIG. 9), and the display unit 230 is installed near the operating unit 210.

The image shooting unit 270 includes a camera 272 that takes an image in color, a lighting fixture 271 that illuminates the component 1 picked up by the head 528 with white light, and a background board 273 mounted on each of the pickup nozzle 534 of the head 528. Here, the background board 273 is made, for example, from glossy paper or a polyvinyl chloride sheet as its material, and a surface at the side of the component 1 is glossy and blue.

For a case the component 1 picked up by the head 528 is transported to the image shooting location A when the component teaching data is generated or the component is mounted, this image shooting unit 270 takes an image of the component 1 with a background of the background board 273, and generates a colored image of the component 1 of which background is blue.

In this way, because the background board 273 in the present variation is glossy blue, it is possible to prevent the background of the colored image from getting darker even if the distance between the lighting fixture 271 and the background board 273 becomes longer.

The controlling unit 220 includes a peripheral device controlling unit 221, an input and output processing unit 222, and an image processing unit 223. The peripheral device controlling unit 221, the input and output processing unit 222 and the image processing unit 223 have the same functions as those of the peripheral device controlling unit 121, the input and output processing unit 122, and the image processing unit 123 in the above embodiment.

In the automatic component teaching device 200 related to this type of the variation, if the component 1 picked up by a pickup nozzle 534 of the head 528 is transported to an image shooting location A, a camera 272 of the image shooting unit 270 takes an image of the component 1 illuminated by the lighting fixture 271. Then, the camera 272 outputs a colored image of the component 1 of which background is blue as a result of the shot image, to the controlling unit 220. From the colored image shot like this, the controlling unit 220 generates a black and white shading image in the same way as the above embodiment, and generates component teaching data based on the black and white shading image and the generation conditions.

Also, the recognition unit 540 provided for the component mounting device 500 recognizes misalignment of the component 1 picked up by the pickup nozzle 534 of the head 528 based on the component teaching data generated in advance by the automatic component teaching device 200, and the colored image generated by the camera 272 when the component is mounted, and drives the head 528 and the pickup nozzle 534 to correct the misalignment. As a result, the component 1 is accurately mounted on a specific location of the board 2.

Since the component mounting device 500 like this serves as a function to generate component teaching data and also a function to mount a component, it is possible to recognize any misalignment more accurately when it is compared with a system that individually and separately provides the automatic component teaching device 100 and the component mounting device. That is to say, in the above system, the scanner 170 of the automatic component teaching device 100, which takes an image of the component 1 is different from a camera, which takes an image of the component 1 picked up by the head of the component mounting device. However, because the camera 272, which is used to generate the component teaching data, is the same as the camera 272, which takes an image of the component 1 picked up by the pickup nozzle 534, in the component mounting device 500, it is possible to prevent errors from being generated due to a difference in the image shooting unit.

In the present variation, the image processing unit 223 is separated from the recognition unit 540 in the controlling unit 220, however either one may have a function of the other. By doing so, the configuration of the component mounting device 500 may be simplified.

(Variation 2)

Here explains a second variation of the automatic component teaching device in the above embodiment.

In the above embodiment, if thickness of the component 1 is great, the component 1 pushes up the cover sheet 173 from the glass board 171*b* and the cover sheet 173 moves away from the lighting fixture 171*d*. As a result, even if the cover sheet 173 is glossy, the background of the colored image of the thick component 1 becomes darker than the background of a colored image of a thin component 1. Therefore, if light intensity of the lighting fixture 171*d* is weak, it may become difficult to generate the component teaching data that accurately indicates a configuration of the thick component 1.

Therefore, the automatic component teaching device related to the present variation uses a background sheet of a glossy member, instead of the cover 172 and the cover sheet 173 of the automatic component teaching device 100 in the above embodiment. In the present variation, regardless of thickness of the component 1, by using this background sheet, it is possible to keep a certain distance between the background sheet and the lighting fixture 171*d*, and to make sure to prevent the background of the colored image from being darker. In short, in the present variation, it is certainly possible to generate component teaching data that accurately indicates a configuration of the component 1 regardless of thickness of the component 1.

Figure 11:
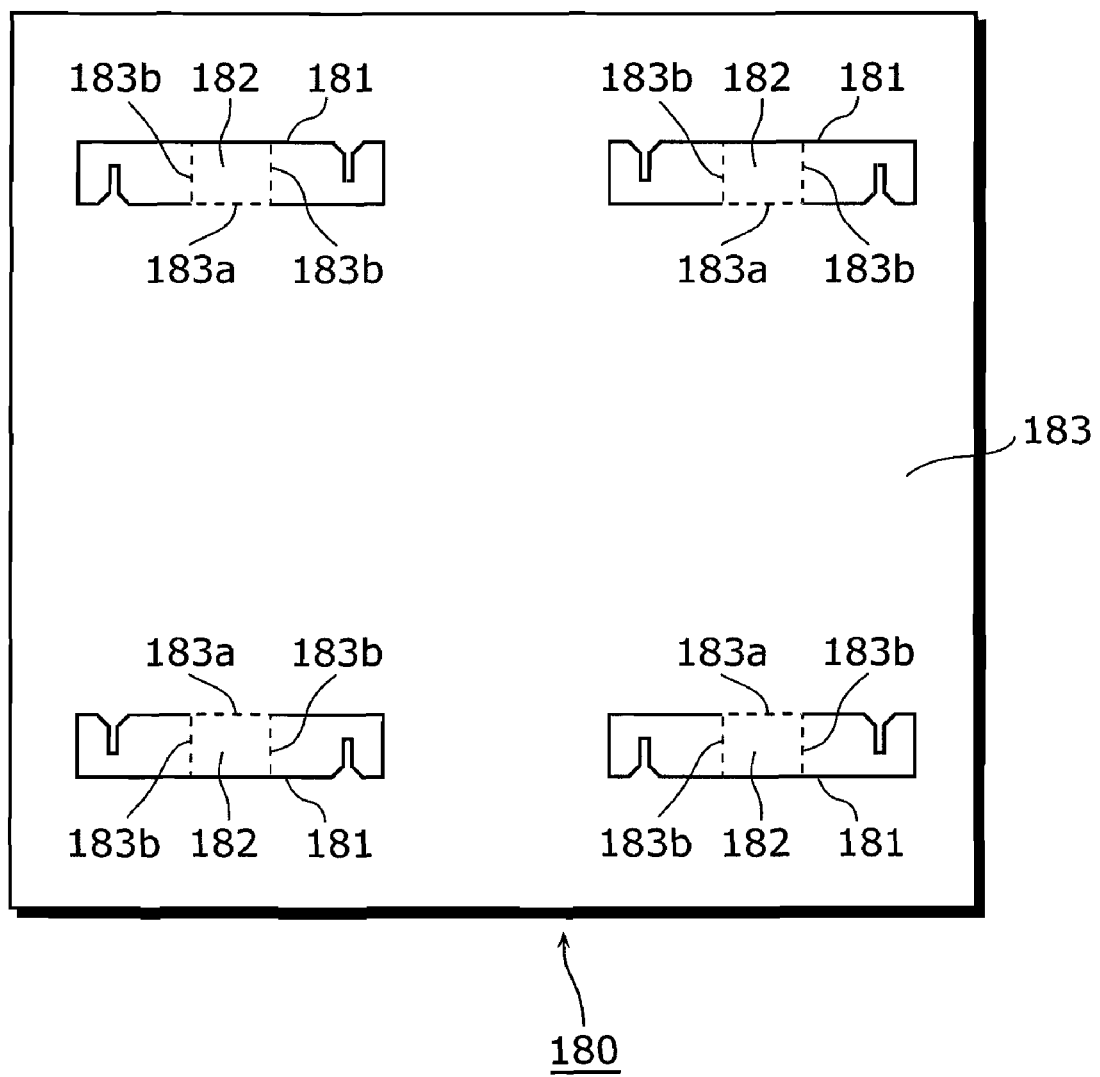
FIG. 11 is a top view diagram of a background sheet related to a variation 2 in the above mentioned invention.

FIG. 11 is an upper surface diagram of the background sheet related to the present variation.

This background sheet 180 is made up of a roughly rectangular-shaped paper painted to be glossy and have even color on its surface. Also, there is a slit 181 formed in areas around four corners of the background sheet 180. A thin rectangular area surrounded by these slits 181 is regarded as a leg piece 182, and other area is regarded as a base 183.

The background sheet 180 like this is transformed and used in a way each of the leg piece 182 is bent over for use from the basic condition shown in FIG. 11.

To be more specific, when the background sheet 180 is transformed from the basic condition to the used condition, the operator bends the leg piece 182 at two bending lines 183b, and both edges of the leg piece 182 are stood up and set against the base 183. Moreover, using a conjunction part between the leg piece 182 and the base 183 as a bending line 183a, the operator raise the center of the leg piece 182 from the base 183 by the bending line 183a as an axis.

Figure 12:
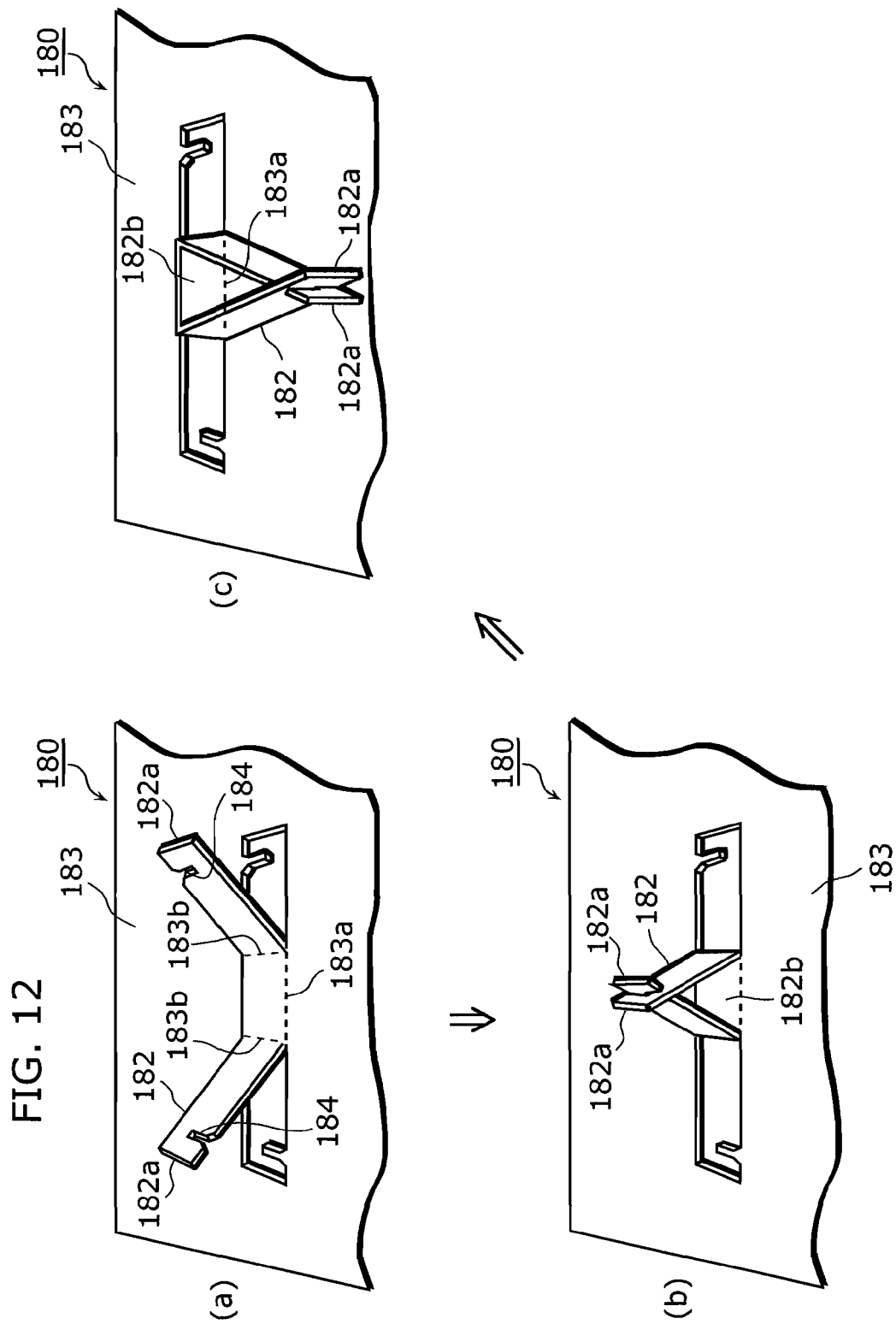
FIG. 12 is a diagram that shows a process how the background sheet related to the variation 2 in the above mentioned invention is distorted into use.

FIG. 12 is a diagram that shows a process how the background sheet 180 is deformed into a usage state.

The operator at first bends the leg piece 182 at the two bending lines 183b as shown in FIG. 12A. As a result, two edge parts 182a located at both edge sides in a longitudinal direction of the leg piece 182 are raised from the base 183. In short, two of the edge part 182a are projected towards the side of the glossy surface of the background sheet 180. A groove 184 is formed respectively on two of the edge parts 182a.

Next, the operator sets in the other edge part 182a into the groove 184 of each of the edge part 182a, as shown in FIG. 12B.

Then, the operator raises the central part 182b located in a center of the longitudinal direction of the leg piece 182 from the base 183 by using the bending line 183a as an axis, as shown in FIG. 12C. As a result, a peripheral border of the edge part 182a of the leg piece 182 makes contacts with the base 183.

In the way like this, if four of the leg piece 182 are bent, the background sheet 180 is in a usage state.

Figure 13:
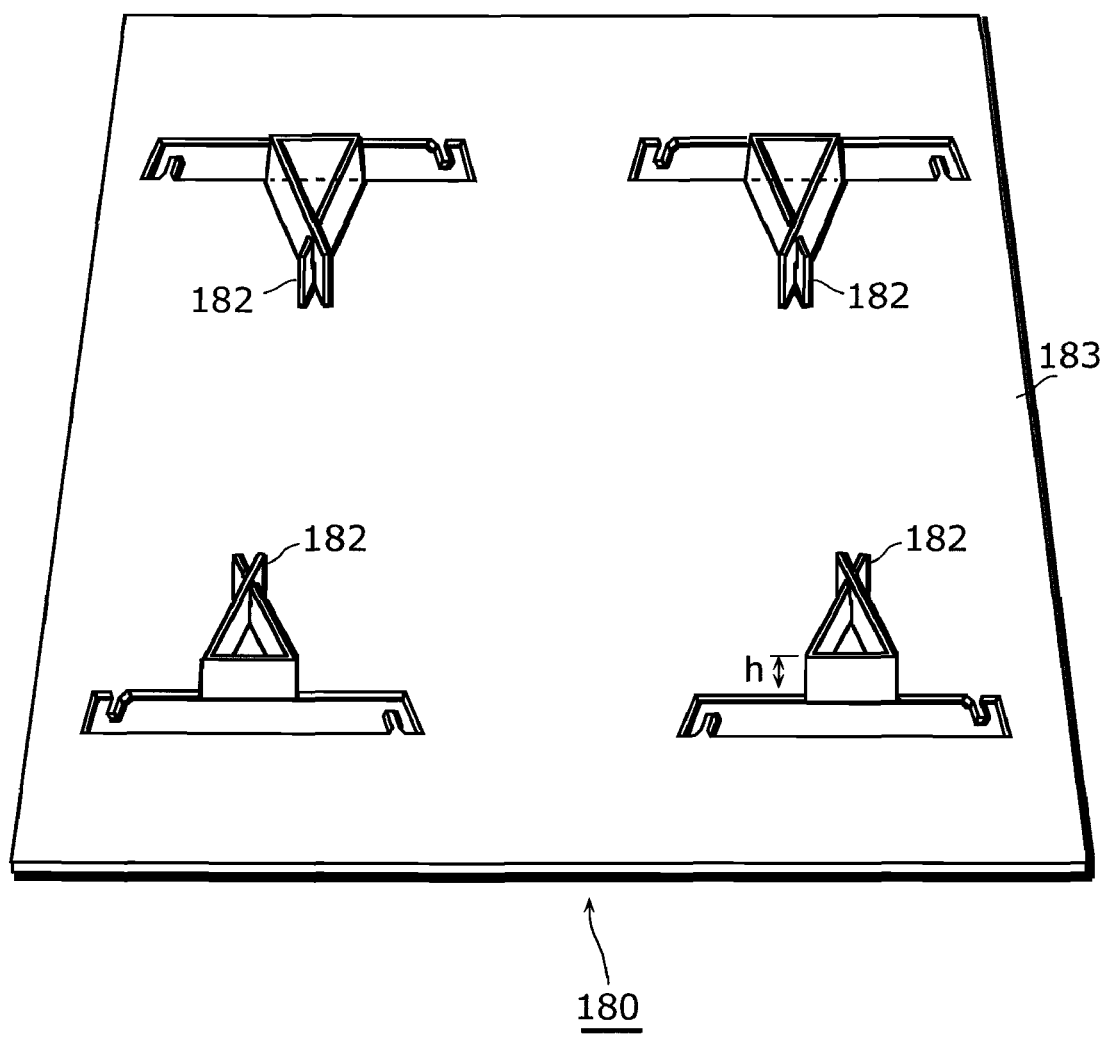
FIG. 13 is a top perspective view diagram that shows usage conditions of the background sheet related to the variation 2 in the above mentioned invention.

FIG. 13 is a top perspective view that shows the usage state of the background sheet 180.

On the background sheet 180 in the use state, four of the leg piece 182 are stood and set in a roughly vertical direction against the base 183. Also, these leg pieces 182 are a rough triangle tubular shape, and are structured in a way that height h is 1 cm from the base 183.

The background sheet 180 in such a usage state is placed and used in a way that the tips of these four leg pieces 182 contact with a glass board of the scanner. In short, a glossy surface colored either in red or blue of the base 183 of the background sheet 180 faces to the glass board of the scanner by keeping a space of 1 cm.

Here, the background sheet 180 consists of one painted paper affixed with another paper.

Figure 14:
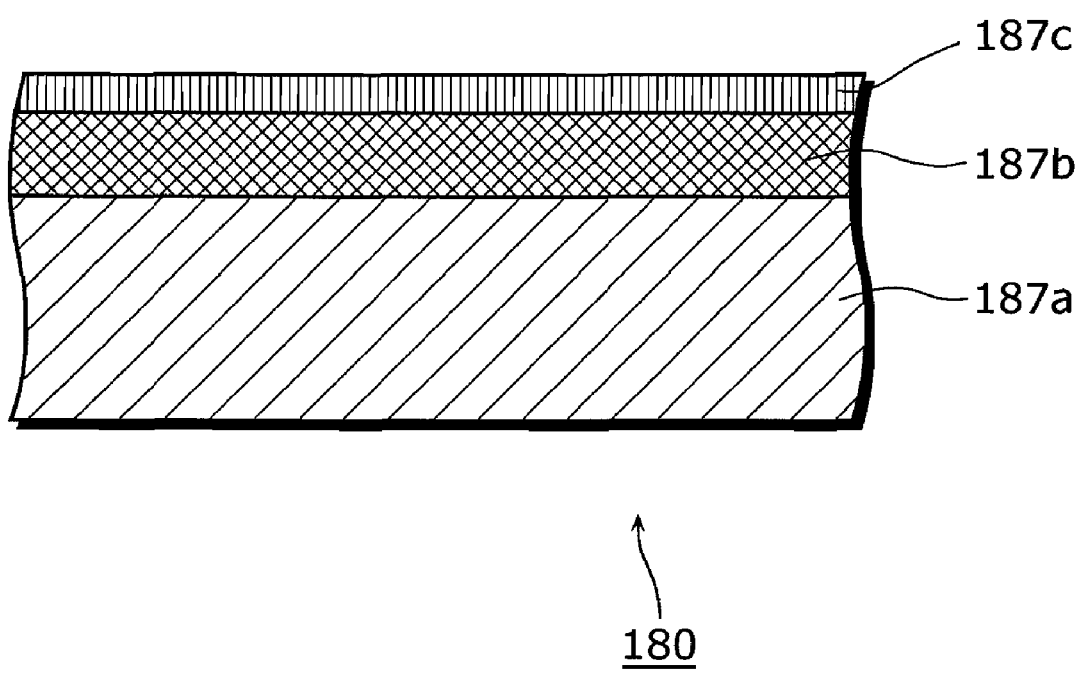
FIG. 14 is a side surface cross-sectional view of a background sheet related to the variation 2 in the above mentioned invention.

FIG. 14 is a lateral cross section diagram of the background sheet 180.

The background sheet 180 includes a base sheet 187a, which has relatively high intensity and is unlikely to bent over, a painted paper 187b, which is affixed to the base sheet 187a and of which paint process on its surface is easy, and paint 187c painted on the painted paper 187b.

The base sheet 187a is, for example, made up of corrugated fiberboard. Also, for the corrugated fiberboard, for example, a so-called E flute is used. Thickness of the E flute is approx. 1.6 mm, and the E flute is configured having approximately 93 pieces of corrugations in its center core, which is 30 cm in width.

The painted paper 187b is, for example, made up of a so-called coat ball.

The paint 187c is made up of water-based polyvinyl resin. For the color of the paint 187c, for example, blue color specified by a color number "DIC 15 version 182" of Dainippon Ink Kagaku Kogyo Co., Ltd. or red color specified by a color number "DIC version 15 182" of Dainippon Ink Kagaku Kogyo Co., Ltd., etc. is used.

Also, when the background sheet 180 used in such a way is fabricated, at first, the painted paper 187b is affixed to the base sheet 187a, and painted on a surface of the painted paper 187b to be glossy and have an even color, as its fabrication method. Then, by bending the base sheet 187a and the painted paper 187b, which are painted and affixed, plural leg pieces 182 are made to be projected from its surface.

In the present variation, the background sheet 180 is configured by affixing the painted paper 187b, which is painted, with the base sheet 187a. However, the background sheet 180 is not limited to this structure, and it may be any kind of structure as long as it has sufficient strength to stabilize the configuration and has one surface which is glossy and evenly colored.

FIG. 15A and FIG. 15B are external view diagrams that show an external appearance of a scanner related to the present variation.

The scanner 170A related to the present variation is made up of the scanner main unit 171 and the background sheet 180 mentioned above, which are as shown in these FIG. 15A and FIG. 15B.

The scanner main unit 171 is structured in the same way as the scanner main unit of the scanner 170 in the above embodiment, which includes the enclosure 171a in a roughly rectangular box shape, an image pickup device 171c and the lighting fixture 171d embedded in the enclosure 171a, and the glass board 171b mounted on an upper surface of the enclosure 171a.

The operator at first places and fixes the component 1 on the glass board 171b when he or she takes an image of the component 1. Then, the operator places the background sheet 180 on the upper surface of the scanner main unit 171 so as to have the top edge of four of the leg piece 182 of the background sheet 180 make contacts with the glass board 171b and to make the base 183 of the background sheet 180 face to the glass board 171b. At that time, a width of a gap between the glass board 171b and the base 183 equals to the height h of the leg piece 182 (h=1 cm). Then, the component 1 is being fit into the gap. In other words, thickness of most of components such as an electronic component to be mounted onto a board is 1 cm or below. Therefore, the most of the components fit into the gap, and there is no case that the component 1 pushes up the base 183 from the glass board 171b and does not separate it for any longer than 1 cm.

Under such a situation, the scanner 170A lights up the component 1, which is placed on the glass board 171b by the lighting fixture 171d of the scanner main unit 171, and generates a colored image of the component 1 of which background is either in blue or red by taking an image of the component 1 in color while it moves the image pickup device 171c.

In the present variation like this, there is a gap, of which width equals to the height h of four of the leg piece 182, between the glass board 171b and the surface of the background sheet 180 being glossy. As a result, even though the component 1 is placed in the gap of the glass board 171b, if the thickness of the component 1 is h or less, the width of the gap between the glass board 171b and the glossy surface of the background sheet 180 does not change. In short, as long as the thickness of the component 1 is h or less, a distance between the glossy surface of the background sheet 180 and the glass board 171b does not change no matter how much thickness the component 1 has. As a result, since the distance between the glass board 171b and the lighting fixture 171d is fixed, the distance between the lighting fixture 171d and the glossy surface of the background sheet 180 having does not change and is fixed regardless of the thickness of the component 1. Therefore, it is possible to keep brightness to a certain stable level on the glossy surface of the background sheet 180, which is illuminated by the lighting fixture 171d regardless of the thickness of the component 1, and make sure to prevent the background of the colored image from being darker due to the thickness of the component 1.

Moreover, in the present variation, even if the component 1 is located in any location, the distance between the lighting fixture 171d and the glossy surface of the background sheet 180 does not change and becomes constant, as long as it is in the above mentioned gap on the glass board 171b. Therefore, it is possible to stabilize brightness on the glossy surface of the background sheet 180, which is illuminated by the lighting fixture 171d regardless of the location of the component 1, and to make sure to prevent the background of the colored image from being darker depending on the location of the component 1.

Also, in the present variation, it is possible to suppress a cost increase for the entire automatic component teaching device since the background sheet 180 can be fabricated from inexpensive paper and paint.

Although the present invention has been described with reference to the embodiment and the variations, the present invention is not limited to these.

For example, though the surface of the cover sheet 173 is set to be blue in the embodiment and the variations, it may be set to be red. In this case, it is possible to clearly distinguish any component, which has a blue type color, from the background, and to generate the component teaching data that accurately indicates a configuration of the component.

Also, in the embodiment and the variations, though the component teaching data is generated after its colored image is converted to an black and white shading image, the component teaching data can be directly generated from the colored image. In this case, for example, it is possible to distinguish a picture element of (R value+G value)/2<B value within each picture element of the colored image. By the way, when the colored image is converted to the black and white shading image, a difference in its contrasting density between an external shape of the component and the background can be made bigger by effectively using the color of the background so that it is possible to clarify the external shape of the component in the black and white shading image and to identify the configuration of the component easily from the external shape.

Also, in the present embodiments and the variations, though glossy paper or a polyvinyl chloride sheet is used as a material of the cover sheet 173, the cover sheet 173 may be made up of, for example, a mirror of which front surface having a blue clear file or a transparent acrylic sheet being attached.

INDUSTRIAL APPLICABILITY

The automatic component teaching device of the present invention has an effect to generate component teaching data that accurately indicates a configuration of a component regardless of the configuration and size of the component, and for example, according to the component teaching data of an electronic component, it is applicable to a component mounting device that recognizes misalignment of the component.

The invention claimed is:

1. An automatic component teaching device that generates component teaching data indicating a configuration of a component to be mounted onto a board, said automatic component teaching device comprising:
   a glossy member having a surface which is evenly colored and glossy;
   a lighting unit, which is formed facing against the surface of said glossy member as a backdrop, operable to illuminate a peripheral area including the component;
   an image taking unit operable to generate a colored image of the component by taking an image in color of the component illuminated by said lighting unit so that the surface of said glossy member becomes a background;
   a data generating unit operable to identify a configuration of the component and generate the component teaching data based on the colored image generated by said image taking unit; and
   a translucent panel having translucency, and on which the component is placed,
   wherein said glossy member includes a holding unit operable to maintain a constant distance between the surface and said lighting unit regardless of a dimension of the component, said holding unit being integrally formed with said glossy member,
   said holding unit is made up of plural pieces that project from the surface of said glossy member, and that support and separate the surface from said lighting unit by a predetermined distance,
   said lighting unit is operable to illuminate the component placed on said translucent panel, via said translucent panel,
   said glossy member is set on said translucent panel such that a tip of each of the plural pieces contacts with said translucent panel and the component can fit between the surface and said translucent panel,
   a height of the plural pieces projecting from the surface of said glossy member is equal to or greater than a thickness of the component,
   said glossy member is made of a rectangular-shaped material having plural slits, and
   the plural pieces are integrally formed with said glossy member by bending an area surrounded by each of the plural slits.

2. The automatic component teaching device according to claim 1,
   wherein the color of the surface of said glossy member is represented as (R, G, B)=(0, 100, 255) when the color is represented as the RGB ranging from 0 to 255 gradation levels.

3. The automatic component teaching device according to claim 1,
   wherein a color of the surface of said glossy member is blue.

4. The automatic component teaching device according to claim 1,
   wherein a color of the surface of said glossy member is made up of a blue component and a green component.

5. The automatic component teaching device according to claim 1,
   wherein each of said plural pieces projects from the surface of said glossy member regardless of a position of said glossy member relative to said transparent panel.

* * * * *